United States Patent
Novotny

(10) Patent No.: US 11,176,082 B2
(45) Date of Patent: Nov. 16, 2021

(54) INHOMOGENEOUS COMPUTER INTERCONNECTS FOR CLASSICAL AND QUANTUM COMPUTERS

(71) Applicant: Mark A. Novotny, Starkville, MS (US)

(72) Inventor: Mark A. Novotny, Starkville, MS (US)

(73) Assignee: Mississippi State University, Mississippi State, MS (US)

( * ) Notice: Subject to any disclaimer, the term of this patent is extended or adjusted under 35 U.S.C. 154(b) by 473 days.

(21) Appl. No.: 15/522,359

(22) PCT Filed: Oct. 27, 2015

(86) PCT No.: PCT/US2015/000119
§ 371 (c)(1),
(2) Date: Apr. 27, 2017

(87) PCT Pub. No.: WO2016/069032
PCT Pub. Date: May 6, 2016

(65) Prior Publication Data
US 2017/0337155 A1 Nov. 23, 2017

Related U.S. Application Data

(60) Provisional application No. 62/122,688, filed on Oct. 27, 2014.

(51) Int. Cl.
*G06F 15/80* (2006.01)
*G06N 10/00* (2019.01)
*G06F 30/394* (2020.01)

(52) U.S. Cl.
CPC ........ *G06F 15/8007* (2013.01); *G06F 30/394* (2020.01); *G06N 10/00* (2019.01)

(58) Field of Classification Search
None
See application file for complete search history.

(56) References Cited

U.S. PATENT DOCUMENTS

| | | | | |
|---|---|---|---|---|
| 7,875,876 | B1 * | 1/2011 | Wandzura | B82Y 10/00 257/26 |
| 2002/0087299 | A1 * | 7/2002 | Novotny | G06F 15/8007 703/21 |
| 2004/0078421 | A1 * | 4/2004 | Routt | B82Y 10/00 709/201 |
| 2009/0231173 | A1 * | 9/2009 | Kilbank | H03M 7/30 341/107 |
| 2009/0321720 | A1 * | 12/2009 | Rose | B82Y 10/00 257/31 |
| 2012/0265718 | A1 * | 10/2012 | Amin | B82Y 10/00 706/12 |
| 2013/0007087 | A1 * | 1/2013 | van den Brink | G06N 99/002 708/800 |

* cited by examiner

*Primary Examiner* — Omar F Fernandez Rivas
*Assistant Examiner* — Bernard E Cothran
(74) *Attorney, Agent, or Firm* — Jones Walker LLP

(57) ABSTRACT

Computer architecture methods and system for providing novel inhomogeneous computer interconnects and interconnect topology framework for both classical and quantum computers are provided that result in enhanced computer functionality and efficiency. The architecture and methodologies include random small world (SW) interconnects or bonds and/or SW interconnects or bonds with constrained randomness.

22 Claims, 9 Drawing Sheets

INHOMOGENEOUS COMPUTER INTERCONNECTS FOR CLASSICAL AND QUANTUM COMPUTERS

CROSS-REFERENCE TO RELATED APPLICATION

This application claims priority from U.S. Provisional Patent Application Ser. No. 62/122,688 filed Oct. 27, 2014. The entirety of that provisional application is incorporated herein by reference.

STATEMENT OF GOVERNMENT SUPPORT

This invention was made with government support under grant DMR-1206233 awarded by the National Science Foundation. The government has certain rights in the invention.

FIELD OF THE INVENTION

The present invention involves a computer architecture framework and, specifically, provides a system, method and process that allows both classical and quantum computers to function by introducing an interconnect topology that has an underlying regular lattice plus inhomogeneous interconnects. The inhomogeneous interconnects are further refined by a system, method, and process of constraining the inhomogeneous interconnects in order to enable the computer architecture framework to be implemented in a practical manner.

BACKGROUND OF THE INVENTION

The present invention provides a method and system for inhomogeneous computer interconnects for classical-computers and for quantum computers. Current and previous classical and adiabatic quantum computer architectures use standard, regular graph interconnect topologies. In other words, the current state of the art has interconnects that are in a regular arrangement or lattice structure.

In graph theory, N nodes are connected by bonds or connections. For the graph theory utilized herein, the connections are un-directed, but in general the method and system for inhomogeneous connections may correspond to directed graphs (ones wherein the bonds are arrows, not just lines). Furthermore, the description herein will only concentrate on connections between two nodes, but the inhomogeneous interconnect connections described below also includes instances wherein the nodes are connected as more than pairs (two-node connections), for example as triples via a three-node connection. Any graph has different measures to distinguish it from other graphs. One important quantity used herein is the node degree, or valency, $d_G(v_j)$ of node j, which is the number of bonds incident to the node j. The average degree $d_{G,Ave}$ is the average of $d_G(v_j)$ over all N nodes. Another important graph theory concept used herein is the concept of the distance between two nodes j and k, $d_d(v_j, v_k)$, defined as the smallest number of bonds that must be traversed in order of go from node j to node k. The average distance $d_{d,Ave}$ is defined as the average of $d_d(v_j, v_k)$ over all $N(N-1)/2$ distinct pairs of nodes.

A classical digital computer is based on binary numbers that may be 0 or 1, and a bit of a classical system is a number that takes on the two values 0 or 1. Operations, such as addition and bit shifting, on binary variables are the basis of every digital classical computer. Here the word 'classical' is to set these current computers apart from quantum computers. A classical computer can also have its bits represented as a vector of length two, where a bit being 1 is represented as the vector (1 0) and the bit being 0 is represented as (0 1). In a classical computer, the operations on bits are carried out by processing elements (PEs), which may be a central processing unit (CPU), a graphical processing unit (GPU), a vector processing unit, or a related unit to operate on input bits and wherein the output is bits. The PEs are connected together in order to pass bits from one PE to another PE or to a group of PEs. Current interconnects are on a regular lattice arrangement.

Quantum computers [RIEFFE2014] operate on qubits, which can be represented as a vector of length two as (a b) where there is a normalization such that the elements of the vector satisfy a $a^*$+b $b^*$=1. Here the * means the complex conjugate, since both a and b may be complex. The description herein will concentrate on adiabatic quantum computers (AQCs), but the description of the inhomogeneous interconnect topology is equally valid for gated quantum computers or other implementations of quantum computers. One actual implementation of a AQC has the qubits implemented physically in hardware as superconducting wire loops with Josephson junctions, but these qubits may be considered as a node in a graph, and indeed this is how they are represented in the graphical web interface of the current D-Wave machine, the D-Wave 2X. In this implementation, the connections between qubits are due to magnetic flux quanta that thread through the superconducting loops associated with two qubits, but these physical connections (sometimes called couplers) may be abstracted to be the bonds between the nodes they connect, and indeed this is how the connections are represented in the graphical web interface of the D-Wave 2X. A flux quanta could also thread through any number m of the superconducting loops that are qubits, leading to m-qubit (sometimes called m-body) interactions between the qubits. Although the description herein will concentrate on 2-body interactions (m=2) as in normal graph theory, the method and procedure herein for using inhomogeneous connections is to be taken to mean inhomogeneous m-body interactions between qubits.

The implemented interconnect topology for all current computers, between PEs for classical computers and between qubits for quantum computers, utilizes a regular arrangement of the nodes and bonds, with these regular graphs are also called lattices. In other words, a lattice is a graph that can be drawn utilizing a repeating arrangement of nodes. For example, FIG. 1 shows a regular graph or lattice. FIG. 1 actually shows a $K_{4,4}$ Chimera computer interconnect that is the basis of the D-Wave 2X, and is further described herein. In a classical computer a given PE may not be functioning, and in a quantum computer a given qubit or a given coupler between qubits may not be functioning. If the underlying topology without the non-functioning elements is a lattice, these disordered cases can be described as a regular lattice with disorder. In most cases, when starting with a regular graph, disorder will increase the average node-to-node distance $d_{d,Ave}$ and also decrease the average of the node degree $d_{G,Ave}$. A lattice here is taken to also include hierarchical lattices. A hierarchical lattice is one where the nodes can be placed into a collection of partially ordered sets of nodes. A hierarchical lattice is sometimes called a fractal, in which the collection of sets displays a repeating pattern at every scale [MANDEL1977].

U.S. Pat. No. 6,996,504 (Novotny) ('504 patent) concerns Small World (SW) interconnects for massively parallel computers, with particular emphasis on SW interconnects to ensure that the parallel discrete event simulation algorithm can be run in a perfectly scalable fashion [WATTS1999, et al.]. This technology is based on a number of publications, most notably [KORNIS2003] and [GUCLU2006]. A recent publication of the inventor and a collaborator described different instances of non-equilibrium surface growth processes related to models for massively parallel computers [KOLAKO2015]. These publications proved that, for a class of algorithms called parallel discrete-event simulations, perfect scalability was possible, but only possible with a particular type of inhomogeneous interconnect between nodes, namely a SW interconnect. A SW interconnect adds some number of random connections in addition to the regular lattice computer interconnects. Therefore, inhomogeneous interconnects due to random connections for classical computers is disclosed and enabled by the '504 patent for random SW bonds. The current embodiments of the present invention expand significantly on current technology by allowing for constrained random SW bonds in classical computer topologies.

The only currently commercially-available adiabatic quantum computer is constructed by D-Wave Systems and is partially described in U.S. Pat. No. 8,700,689 (Macready, et al) ('689 patent). The current version of the machine, the D-Wave 2X, has approximately 1000 qubits connected in the $K_{4,4}$ Chimera lattice arrangement and has qubits with interconnections (bonds) strengths $J_{j,k}$ between qubits j and k that may be set to particular values and node biases (values on the nodes) $h_j$ for qubit j that may be set to a particular strength. The machine has disorder in that the chip installed has 1097 functioning qubits of the 1152 total qubits and the 1152 qubit chip is arranged as a square lattice of size 12×12 unit cells, with each unit cell being an eight qubit $K_{4,4}$ arrangement. FIG. 1 is a schematic illustration showing a $K_{4,4}$ Chimera computer interconnect, as in the D-Wave 2X architecture, here a 3×4 arrangement of the underlying $K_{4,4}$ unit cells.

Quantum computers, both gated quantum computers and adiabatic quantum computers, did not exist at the time the SW technology and the technology of the '504 patent was conceived. The present invention provides for any inhomogeneous computer interconnect topology for quantum and adiabatic quantum computers, including random SW bonds and SW bonds with constrained randomness.

SUMMARY OF THE INVENTION

The present invention involves a system, method, and process for providing inhomogeneous computer interconnects for classical and/or quantum computers. The invention discloses that, for both classical and quantum computers, novel inhomogeneous interconnects provide enhanced functionality and efficiency.

The interconnect graph of both massively parallel classical computers and quantum computers is critical to the functionality of the computer. All known current and past classical and adiabatic quantum computers that have been implemented use a regular graph interconnect topology. Introducing an interconnect topology that has an underlying regular lattice (current technology) plus the inhomogeneous interconnects, which the present invention discloses, allows for increased functionality for both classical and quantum computers.

With the foregoing and other objects, features, and advantages of the present invention that will become apparent hereinafter, the nature of the invention may be more clearly understood by reference to the following detailed description of the preferred embodiments of the invention and to the appended claims.

BRIEF DESCRIPTION OF THE DRAWINGS

These drawings accompany the detailed description of the invention and are intended to illustrate further the invention and its advantages. The drawings, which are incorporated in and form a portion of the specification, illustrate certain preferred embodiments of the invention and, together with the entire specification, are meant to explain preferred embodiments of the present invention to those skilled in the art.

DETAILED DESCRIPTION OF THE INVENTION

The present invention provides for any inhomogeneous computer interconnect topology for classical computers and/or quantum computers. Quantum computers differ from classical computers. Classical digital computers use data encoded to binary digits (bits), which are one of two states (0 or 1) and quantum computers use quantum bits (qubits) that can be in superpositions of states. A quantum computer uses qubits which can be a 1 or a 0, or both at the same time, rather than using or storing information as 0s or 1s as do conventional or classical binary computers. This superposition allows quantum computers to utilize combinations of bits simultaneously, thereby enhancing the speed and power of the quantum computer.

The architecture and architectural framework, and the method and system, of the present invention provide for inhomogeneous interconnects for both classical and quantum computers and architecture with the goal to allow for an increase of functionality at relatively little additional engineering cost. Moreover, overall computing efficiency is enhanced since the average distance between nodes, $d_{d,Ave}$, is decreased significantly. The interconnect topology starts with a regular lattice, or a disordered regular lattice for the interconnect topology. The inhomogeneous interconnects of the present invention are added to the regular lattice interconnects, and may be between randomly chosen nodes. If the bonds are between randomly chosen nodes, they are called SW bonds. SW bonds for classical computer interconnect topology is disclosed in the '504 patent. The inhomogeneous interconnects may also be different from SW bonds in order to reduce engineering costs, yet maintaining the overall benefits of the inhomogeneous interconnects. The difference is that SW bonds are between randomly chosen pairs of qubits, while herein the inhomogeneous bonds may also be between pairs of qubits that are chosen in a semi-random fashion, namely be chosen using randomness with some constraints. These types of inhomogeneous interconnects may be termed as constrained SW bonds. Several implementations of constrained SW bonds are disclosed herein. The inhomogeneous interconnects of the invention can also be used to enhance answer-checking procedures in adiabatic quantum computers.

The figures described herein may be in color or in black-and-white, and the descriptions presented are valid and complete for either black-and-white or color figures. All descriptions are complete for black-and-white figures. Some descriptions will note colors in square brackets, such as [pink], but if the figures are in black-and-white, the square brackets may be ignored.

Figure 1:
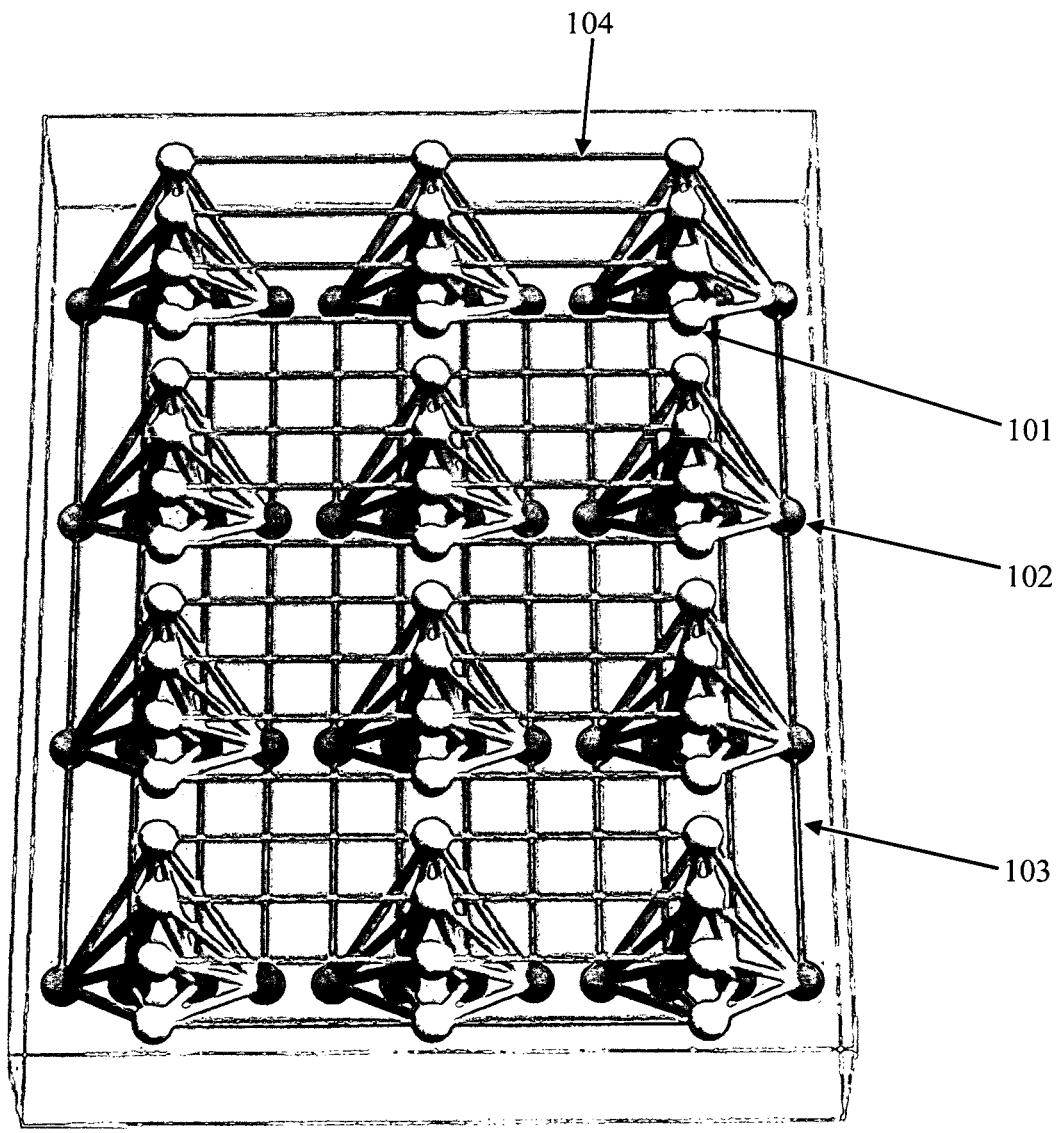
FIG. 1 is a schematic illustration of the invention showing a $K_{4,4}$ Chimera computer interconnect, as in the D-Wave 2X architecture, here a 3×4 arrangement of the underlying $K_{4,4}$ unit cells.

Quantum computers, both gated quantum computers and adiabatic quantum computers, were not technologically possible prior to the Small World (SW) patented computer interconnect technology ('504 patent). The only currently-available adiabatic quantum computer is by D-Wave Systems ('689 patent) and has qubits with interconnections that may be set to a particular strength. The regular array is a $K_{4,4}$ Chimera graph, as shown in FIG. 1, which depicts a $K_{4,4}$ Chimera computer interconnect, as in the D-Wave 2X architecture. The FIG. 1 schematic has a 3×4 arrangement of the underlying $K_{4,4}$ blocks (or unit cells), whereas the current D-Wave 2X has an 12×12 array of the $K_{4,4}$ blocks for a total of 1152 qubits. The stated goal of D-Wave is to increase substantially the number of qubits in the computer. In a $K_{4,4}$ Chimera graph, the qubits can be viewed as in two layers. Each unit cell has 4 qubits in the top layers, [cyan] spheres labeled 101 in FIG. 1. Each unit cell has 4 qubits in the bottom layers, [blue] spheres labeled 102 in FIG. 1. Within a unit cell, every top [cyan] qubit is connected to every bottom [blue] qubit by [green] bonds. From one unit cell to the next, the 4 [blue] bottom layer qubits are connected to their associated qubits in neighboring unit cells by the vertical [gray] bonds labeled 103 in FIG. 1. From one unit cell to the next, the 4 [cyan] qubits in the top layer have only horizontal interconnects, the horizontal [yellow-orange] bonds labeled 104 in FIG. 1. As shown recently, the Chimera lattice causes the functionality of the D-Wave adiabatic quantum computer with about 500 qubits to perform at best only comparable to the best algorithms on classical computers [RONNOW2014]. One of the major reasons for this result is that, although the 512 $K_{4,4}$ Chimera graph has about 448 interconnects between the $K_{4,4}$ blocks, it only takes cutting 32 bonds in order to break the lattice into two parts. Moreover, the typical path length (in the graph theory sense) between any two qubits grows as the square root of the number of qubits. In fact, it has been shown that, because a Chimera lattice only has a zero-temperature spin glass phase transition (rather than a finite-temperature spin glass phase transition), Chimera lattices could be blind to quantum speedup [KATZGR2014].

Figure 2:
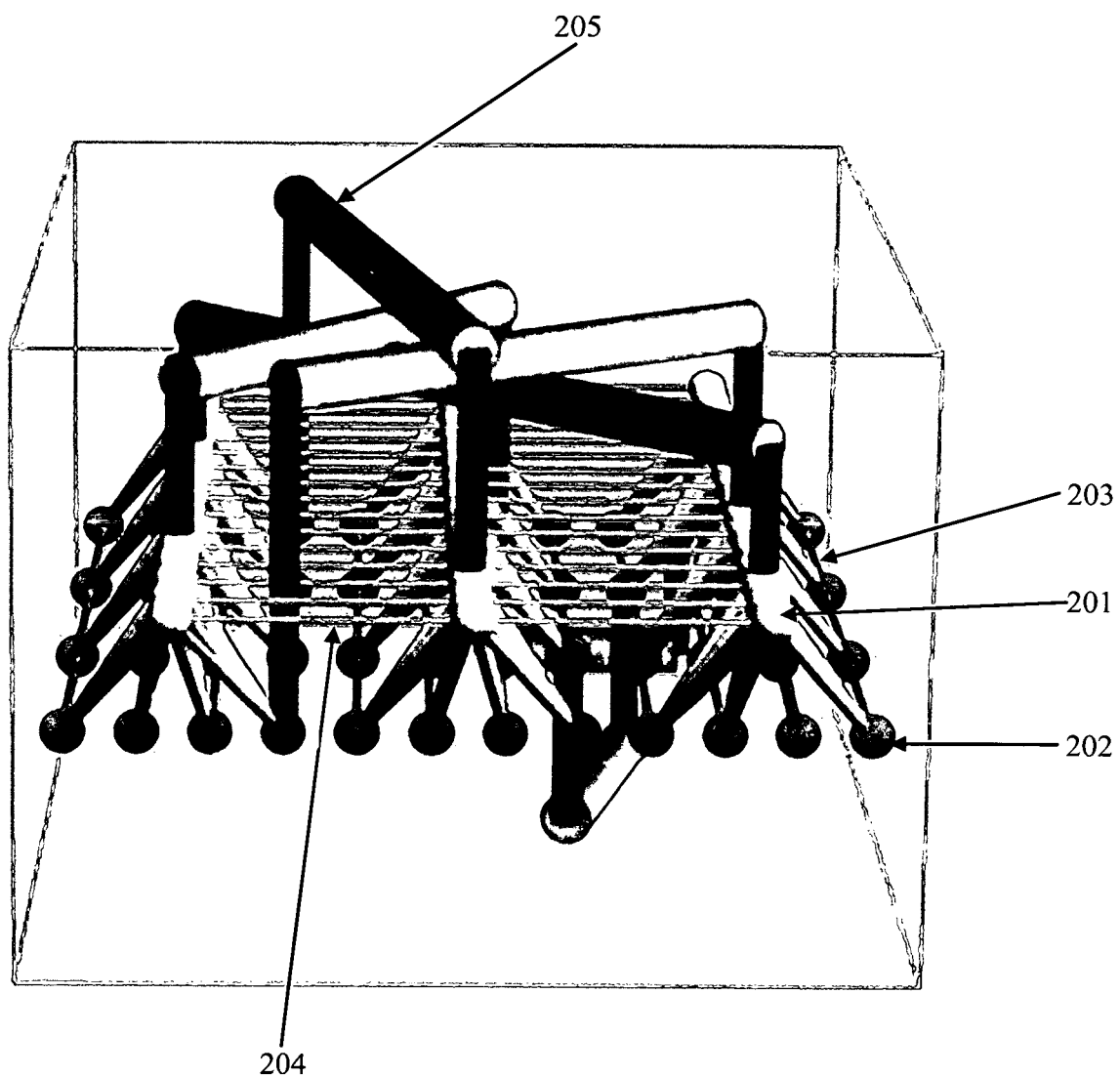
FIG. 2 is a schematic illustration of the invention showing a $K_{4,4}$ Chimera computer interconnect, as in the D-Wave 2X architecture, with each $K_{4,4}$ block having one inhomogeneous bond [red cylinders] and the underlying Chimera lattice is a 3×4 arrangement.
Figure 3:
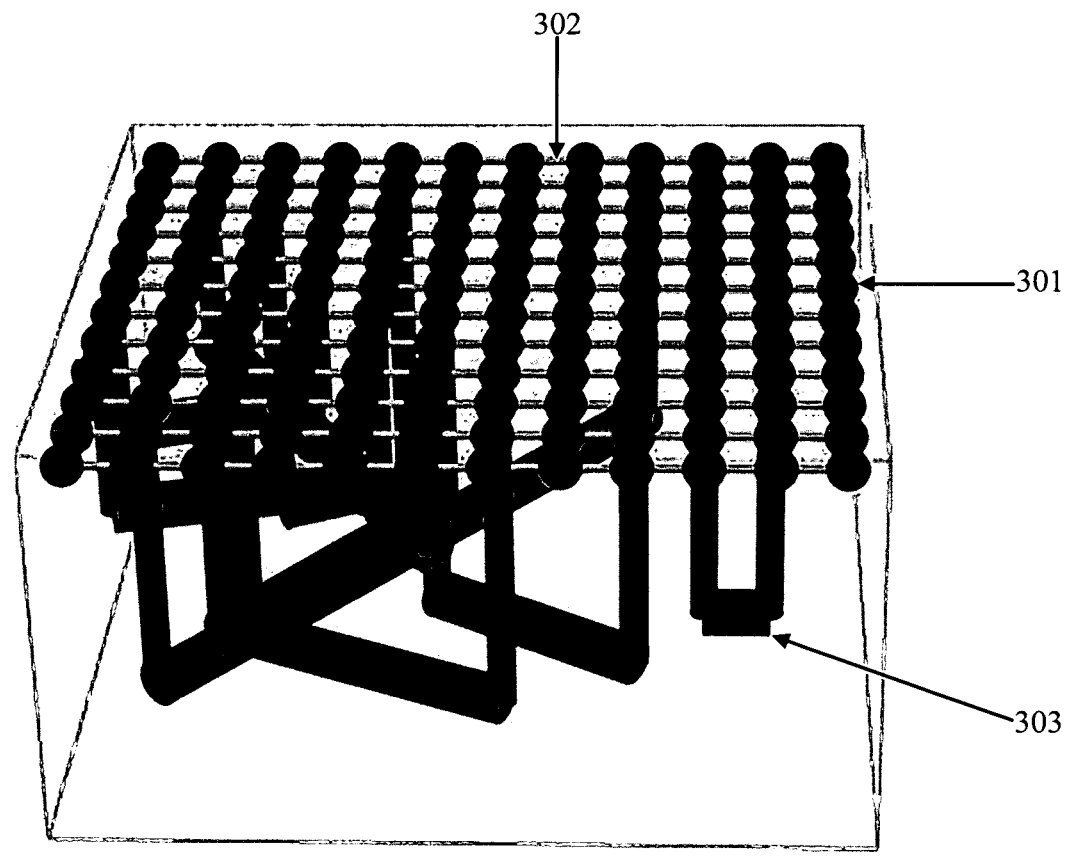
FIG. 3 is a schematic illustration of the invention showing a square lattice computer interconnect, with inhomogeneous connections [red cylinders].

For a small density of SW interconnects, the typical path length (node-to-node distance) between qubits grows only as the logarithm of the number of qubits [KORNIS2003, GUCLU2006, WATTS1999, et al]. Therefore, adding SW interconnects to the Chimera lattice, as in FIG. 2, will substantially increase the functionality of an adiabatic quantum computer. FIG. 2 shows a $K_{4,4}$ Chimera computer interconnect, as in the D-Wave 2X architecture, with each $K_{4,4}$ block having one inhomogeneous bond [red cylinders]. The underlying Chimera lattice is 3×4 in FIG. 1. The viewpoint has changed from FIG. 1. FIG. 2 labels the bottom layer [blue] qubits as 201, the top layer [cyan] qubits as 202, the bottom layer interconnecting [gray] bonds between qubits in the bottom layer as 203, and top layer interconnecting [yellow-orange] bonds between qubits in the top layer as 204. In addition, FIG. 2 shows six inhomogeneous bonds, the [red] cylinders, one of which is labeled 205. The inhomogeneous bonds in FIG. 2 are constrained SW bonds: one constraint is that at most one SW bond can be attached to any qubit, and the second constraint is that the inhomogeneous connections can only connect top-to-top or bottom-to-bottom qubits (there are no inhomogeneous connections between qubits in the top layer and qubits in the bottom layer). The benefit of adding these SW bonds does not depend on the underlying regular lattice. For example, a square-lattice arrangement of qubits, as in FIG. 3, would similarly benefit substantially from SW interconnects. FIG. 3 shows 144 qubits, denoted by [blue] spheres, with one labeled 301. The qubits are arranged on a square lattice, with one nearest-neighbor coupler shown as the [yellow] cylinders that all lie in a single plane, one of which is labeled 302. FIG. 3 shows a regular square lattice computer interconnect, with inhomogeneous connections [red cylinders] one of which is labeled 303. These inhomogeneous connections are SW bonds, because no constraints were used to generate the bonds, such that they were between randomly-chosen pairs of qubits.

The benefit of a SW interconnect topology, or constrained SW interconnect topology, AQC can be expressed in terms of universality and critical behavior of systems. Consider a two-dimensional (2D) planar system, as the square lattice in FIG. 3 (without the inhomogeneous interconnects). Then the critical exponents of a particular model, such as the Ising model, is determined by the 2D nature of the lattice. Similarly for a Chimera lattice, because as the lattice becomes larger it only becomes larger in two dimensions (it continues to only have two layers). It has been shown that, because of the 2D nature, a Chimera lattice is blind to quantum speedup [KATXGR2014]. Consequently, an adiabatic quantum computer with a Chimera lattice has too simple of an interconnect topology to be able to simulate problems in the complexity class NP-hard. However, adding any finite density of SW bonds changes the universality class from that associated with the underlying regular lattice to one associated with (anomalous) mean-field behavior [HASTIN2003]. A mean-field spin glass has a finite-temperature phase transition, and furthermore has critical exponents associated with a mean-field (infinite-dimensional) system. Therefore an adiabatic quantum computer with inhomogeneous bonds, SW bonds or constrained SW bonds, will be able to solve the most difficult problems that any adiabatic quantum computer can solve, namely those in the complexity class NP-hard.

The square-lattice interconnect topology of FIG. 3 is similar to the interconnect arrangement of the MasPar classical computer from the 1980s. The [blue] spheres in FIG. 3 are now PEs, and the bonds are connections between PEs. The MasPar would have similarly benefited from the SW interconnects. In particular, the SW interconnects would change the average communication time between two nodes from growing as the square root of the number of nodes to growing as a logarithm of the number of nodes. The underlying regular lattice need not be planar as in FIG. 3, or two-layer planar as in FIGS. 1 and 2. The SW interconnects when connected to any regular lattice in D-dimensions, for example to a three-dimensional (3D) hypercube regular interconnected topology, would still enable the average length between nodes to only grow logarithmically in the number of nodes. One example of a three-dimensional (3D) interconnect topology is that of the IBM Blue Gene/Q. For a classical computer, the average length between nodes translates into the average time required for one node to communicate with another node. Thus, SW interconnects can be very useful as interconnects for classical computers, for example by enabling perfectly scalable implementations of algorithms such as the discrete-event-simulation algorithm [KORNIS2003, GUCLU2006].

Figure 4:
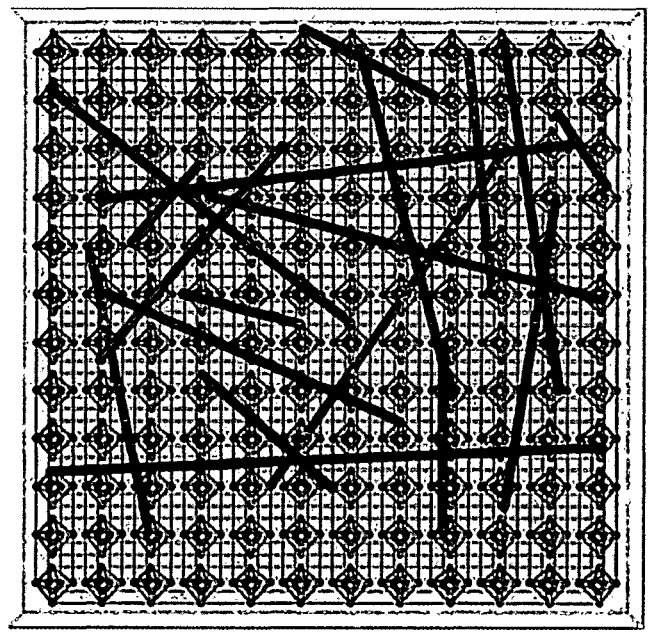
FIG. 4 is a schematic illustration of the invention showing a 12×12 Chimera lattice, with added inhomogeneous interconnects [red cylinders].
Figure 5:
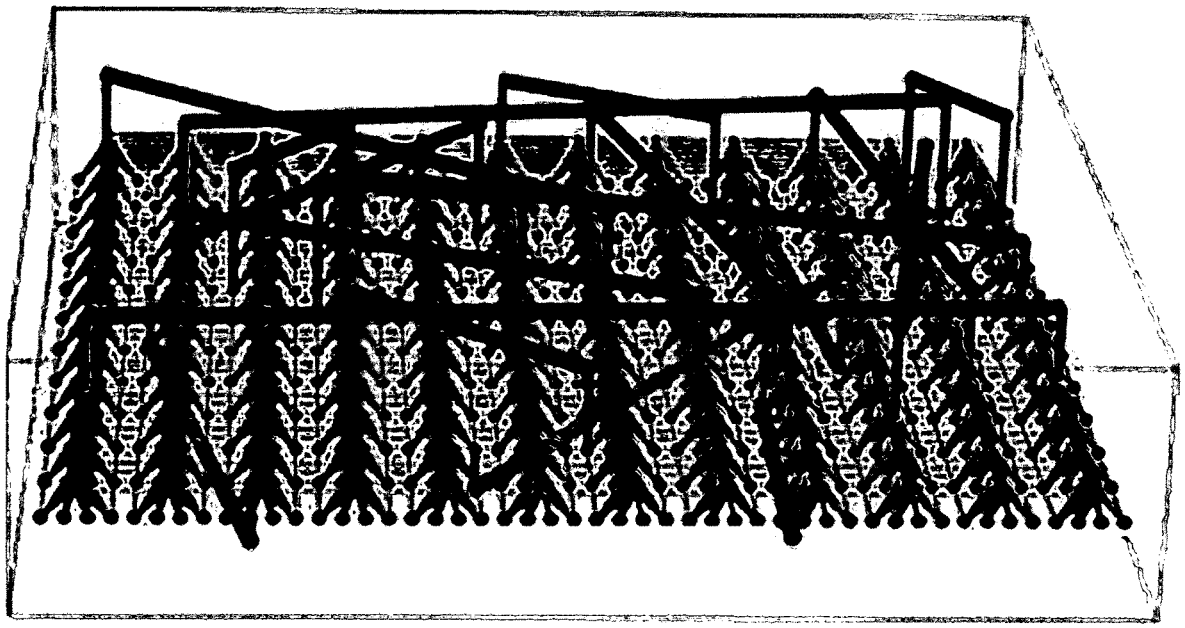
FIG. 5 is a schematic illustration of the invention showing a 12×12 Chimera computer interconnect, with inhomogeneous connections [red cylinders] where the inhomogeneous connections are completely random and therefore are Small World (SW) connections.

As seen in FIG. 3, the SW property still holds even if every node is not connected to a SW bond. The SW property of the average node-to-node distance growing logarithmically in the number of nodes still holds, as long as a finite density of SW bonds is present [WATTS1999, KORNIS2003]. For the $K_{4,4}$ Chimera lattice on a 12×12 grid (FIG. 4), the number of qubits is 1,152 (the size of the current product release of the D-Wave 2X adiabatic quantum computer). FIG. 4 shows a 12×12 Chimera lattice, with added inhomogeneous interconnects as [red] cylinders. A small number of SW interconnects (in FIG. 4, there are eighteen (18) inhomogeneous interconnects), would substantially decrease the average path length between qubits. The same graph, from a different viewpoint, is shown in FIG. 5. FIG. 5 shows a 12×12 Chimera computer interconnect, with inhomogeneous connections [red cylinders], where the inhomogeneous connections are completely random and therefore are Small World (SW) connections. Note the large number of different levels required in order for the SW connections to not touch each other. This lattice is the same as the one in FIG. 4, but the viewpoint is rotated to see the height of the inhomogeneous connections.

FIGS. 2, 3, and 5 illustrate one of the most significant practical barriers to implementing SW interconnects, namely that the number of different heights of SW interconnects must grow quickly in order for interconnects to not touch or cross. Each additional height on a D-Wave device corresponds to an additional layer that needs to be added in the processing stage of the chip of the device. Each layer provides additional expense and can cause additional alignment difficulties. Therefore, a normal SW interconnect arrangement for a large D-Wave device, as in FIGS. 4 and 5, may be impractical due to engineering and economical constraints.

Figure 6:
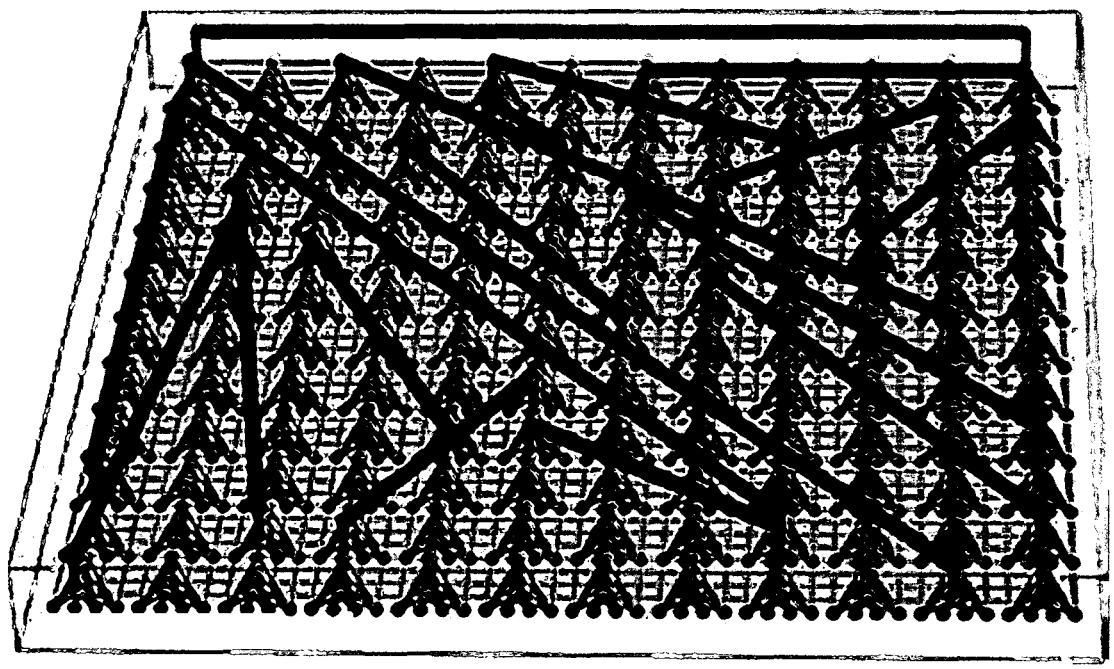
FIG. 6 is a schematic illustration of the invention showing a Chimera lattice, with inhomogeneous interconnects [red cylinders], all of which are in only one layer.
Figure 7:
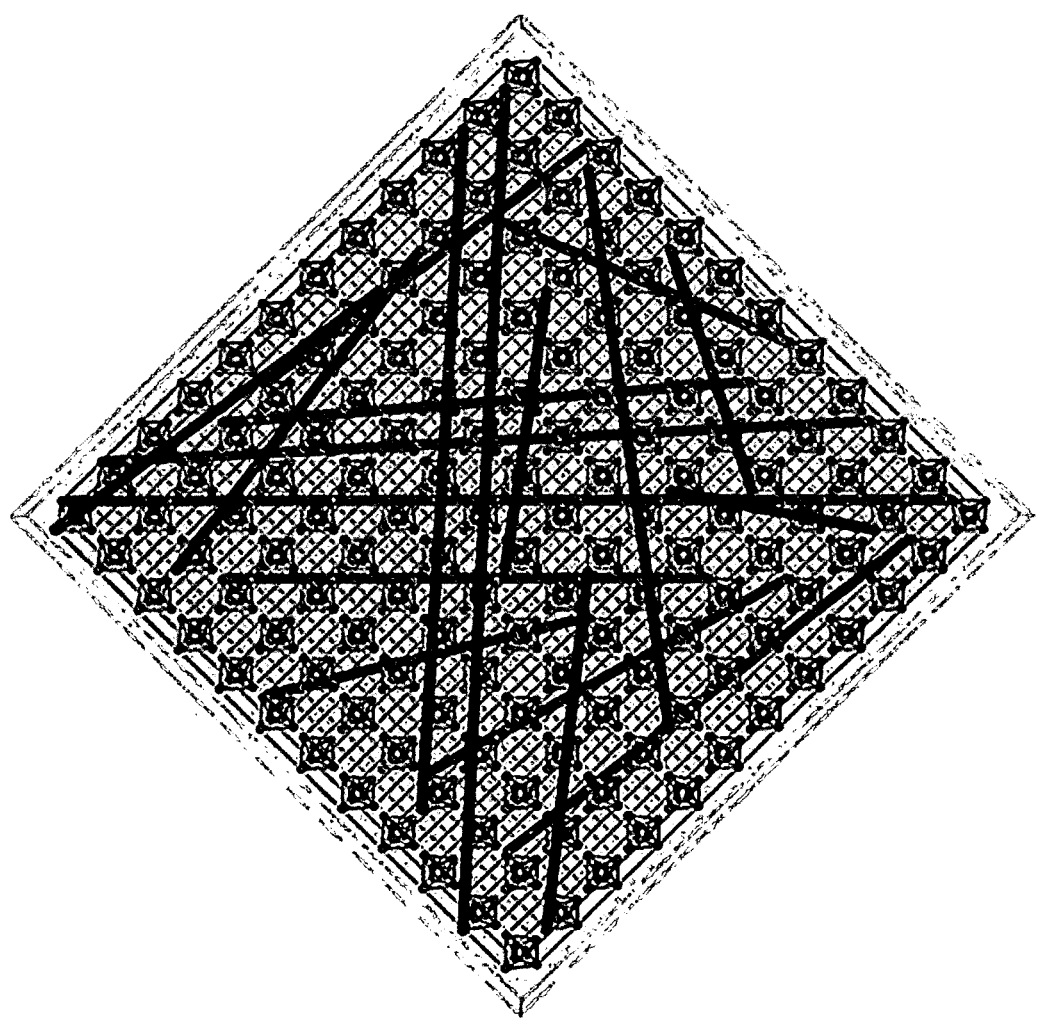
FIG. 7 is a schematic illustration of the invention showing a 12×12 Chimera lattice, with inhomogeneous interconnects [red cylinders], which can all lie on two additional layers.
Figure 8:
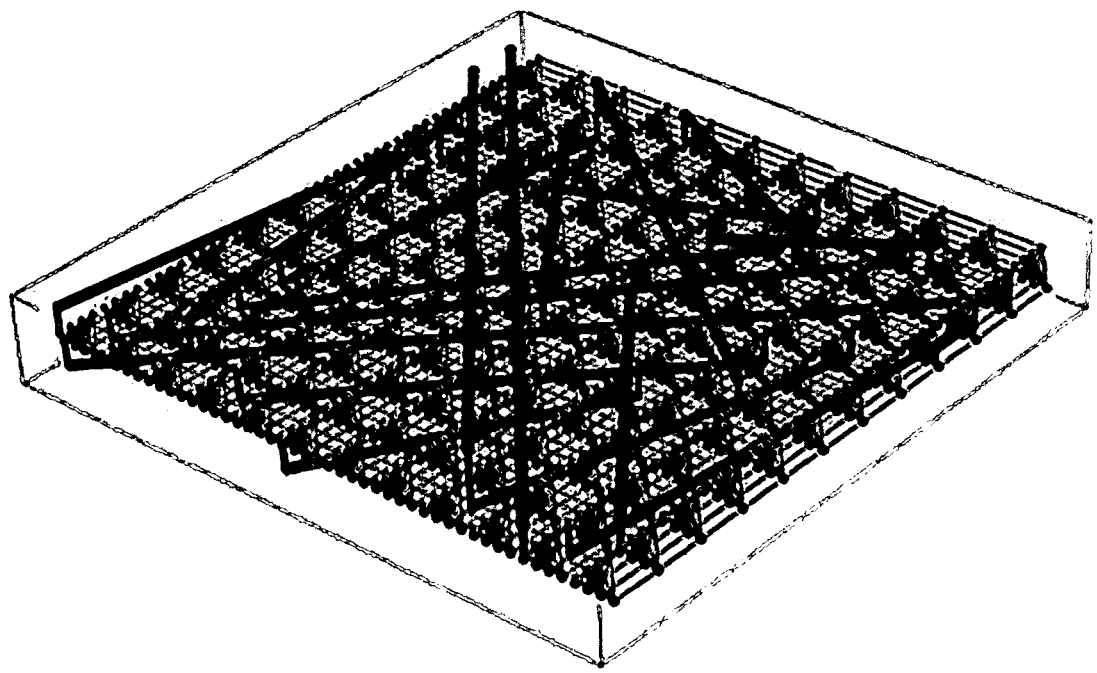
FIG. 8 is a schematic illustration of the invention showing a Chimera lattice, with inhomogeneous interconnects [red cylinders], on two additional layers similar to FIG. 7 but where the viewpoint is rotated.

The completely random nature of SW interconnects can be relaxed, while keeping the desired properties of SW interconnects. In order to keep the average path length between nodes growing slowly with increased system size, one can require a semi-random, inhomogeneous arrangement of bonds (constrained randomness) while keeping the inhomogeneous aspect of the bonds. Such an arrangement keeps the SW character by being between completely regular and completely random graphs [WATTS1999]. A semi-random, inhomogeneous arrangement (one with constrained randomness) is one where there are additional constraints imposed on the randomness. This is shown in FIG. 6 for a 1152 qubit Chimera lattice. FIG. 6 shows a Chimera lattice with inhomogeneous interconnects [red cylinders], all of which can be implemented to lie in only one layer. In the case of FIG. 6, the constraint on the inhomogeneous bonds is a global constraint, namely that no crossing of the inhomogeneous interconnects is allowed. The eighteen (18) inhomogeneous interconnects in FIG. 6, the same number as in FIG. 5, now can all be on the same level with no crossing of interconnects. In practice, for a particular graph of a device, one would want to minimize the average node-to-node length while keeping the number of additional required layers in the manufacturing process fixed at a small value; for example, the number of layers should be less than or about equal to ten. In FIG. 6, the number of added layers is one. Since a $K_{4,4}$ Chimera lattice is already a two-layer graph, it might be worthwhile to have the constraint to be two added layers, one for the 4 qubits in the bottom layer of each unit cell and one for the 4 qubits in the upper layer of each unit cell. This is illustrated for eighteen (18) inhomogeneous interconnects in FIGS. 7 and 8. FIG. 7 shows a 12×12 Chimera lattice with inhomogeneous interconnects [red cylinders] constrained to lie on two additional layers. FIG. 8 shows a Chimera lattice with inhomogeneous interconnects [red cylinders] on two additional layers, similar to the interconnect arrangement of FIG. 7, but the viewpoint is rotated. From this viewpoint, it can be seen that the inhomogeneous interconnects in the layer above the Chimera lattice has [red] bonds mainly in the North-South direction, while the layer below the Chimera lattice is mainly in the East-West direction. As seen in FIG. 8, having one layer with added interconnects mainly North-South and the other layer with the added interconnects mainly East-West allows for on-average longer interconnects, thereby decreasing significantly the average node-to-node distance.

The inhomogeneous interconnects for a classical computer may be physically the same as the regular lattice interconnects between the nodes. For example, if InfiniBand interconnects are used on the regular lattice, they may be used also for the inhomogeneous interconnects. However, that is not required and may sometimes not be advantageous. For example, for perfectly scalable parallel discrete event implementations, the inhomogeneous interconnects need only minimal bandwidth since, for each node, only the virtual time of the algorithm is communicated along these inhomogeneous interconnects. In contrast, information about events near the 'boundary' is communicated between two PEs along the bonds of the regular lattice. Therefore, for parallel discrete event algorithms, the inhomogeneous interconnects that form the regular lattice must have a larger bandwidth than do the interconnects that form the inhomogeneous interconnects.

The same is true for inhomogeneous interconnects in quantum computers of the present invention. They may be the same or they may be different from the interconnects used in the regular lattice. For example, consider the D-Wave 2X with its $K_{4,4}$ Chimera lattice. Each interconnect can be set to any value in some range, for example, between −1 and 1. The inhomogeneous interconnects may have the same dynamic range. However, in programming the D-Wave 2X what one often desires is to clone two qubits so that they will have the same value in the answer returned by the D-Wave 2X. This can be done by setting the value of the interconnect to the highest possible value in the dynamic range. This type of cloning ensures that, with a high probability, the answer from the D-Wave 2X will have the cloned bits either both +1 or both −1. This type of cloning along an inhomogeneous interconnect can be done if the allowed values of the strength of the inhomogeneous bond was only zero or +1. Another useful type of interconnect does anti-cloning so, with high probability in the answer, one anti-cloned bit output answer bit of a pair is +1 and the other is −1. This can be accomplished by allowing the strength of the inhomogeneous interconnects to be only the three values −1, 0, or +1. Limiting the dynamic range of the inhomogeneous interconnects would ease significantly the engineering requirement, while keeping the majority of the functionality of the inhomogeneous interconnects.

The current D-Wave 2X computer has 1152 qubits in an 12×12 arrangement. However, only some of these qubits and some of the interconnects that connect to the qubits are dynamical variables over which users have control. The current D-Wave 2X device installed at NASA QuAIL has 1097 accessible qubits on the Chimera lattice. The qubits that have an inability to be tuned are due to defects in the manufacturing process of the particular device. This missing-qubit type of inhomogeneity increases the average node-to-node distance from that of a completely regular graph. The underlying qubit arrangement for the user is a lattice with disorder. The semi-random inhomogeneous interconnects of the present invention have the novel property of decreasing the typical node-to-node length.

Figure 9:
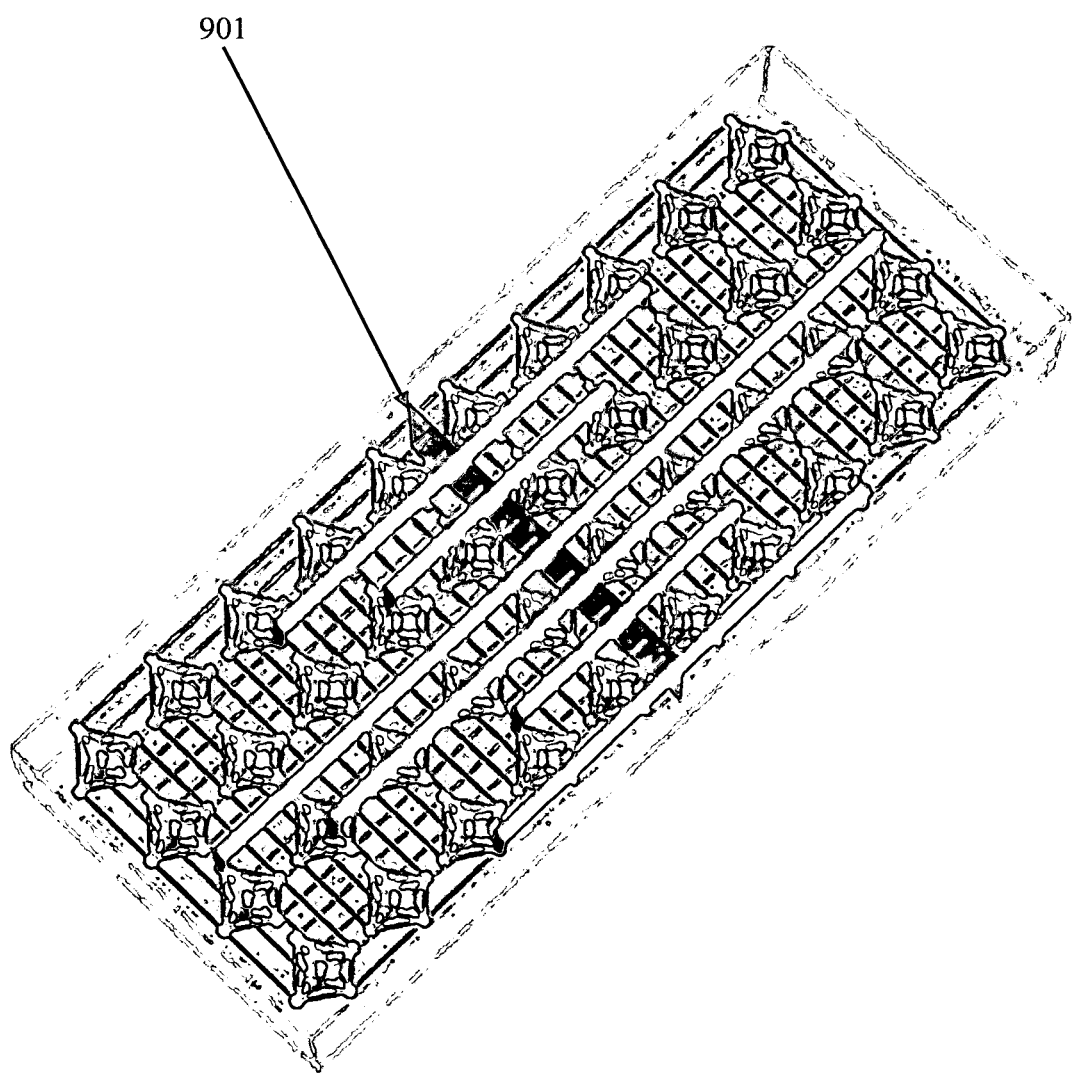
FIG. 9 is a schematic illustration of the invention showing a Chimera lattice that is 10×4, illustrating inhomogeneous interconnects to clone ½ of the qubits for answer checking.

An adiabatic quantum computer is a probabilistic machine. There is only a (hopefully high) probability that the answer returned is the actual answer that minimizes the set of parameters given to the computer. Classical computers can be used to simulate a quantum computer, such as the D-Wave 2X. However, the difficulty in the classical simulation, in terms of the required computer time to solve the problem, increases quickly with the number of qubits. For a 128 qubit D-Wave II, a typical laptop computer can find solutions as quickly as can the D-Wave II—a typical laptop costs about $1000, while a D-Wave II costs about $12 million. For the previous generation, the D-Wave II has about 500 qubits and answers can be checked on modern high-end workstations. Once the D-Wave II has about 4000 qubits, no modern classical supercomputer would be able to check whether the returned answer is the correct answer (rather than just a reasonably good answer). It is possible to perform answer-checking on the D-Wave architecture. This is illustrated in FIG. 9, which shows a Chimera lattice that is 10×4, illustrating inhomogeneous interconnects to clone ½ of the qubits for answer checking. The (imaginary) plane for the cloning [purple], labeled 901, splits the Chimera lattice into two equal parts. The plane is imaginary because it is not implemented in the hardware of the adiabatic quantum computer. Chimera bonds also go through the purple plane, in addition to the (here six (6)) added inhomogeneous [red bonds] interconnects. One can consider a division of the Chimera lattice into two identical parts. This is done by inserting an imaginary [purple] plane in FIG. 9 between two halves of the lattice. The inserted plane is regarded as a mirror, so one-half of the lattice is the mirror image of the other half. If defects (disorder) exist in the lattice, such defects must also have mirror images which can be accomplished by setting all interconnects for that qubit to zero, thereby disconnecting it from the rest of the Chimera lattice. All interconnects that cross the mirror plane are set to the highest allowed positive value to clone the associated qubit on the other side of the [purple] mirror symmetry plane. All other dynamical parameters are set to have the mirror-image property. Then, if the answer returned has the mirror-image relationship, the probability that the answer is the correct answer is much higher than if the two halves were disconnected and then solved. The probability increase is a direct function of the average node-to-node length. Therefore, if inhomogeneous, semi-random interconnects that clone qubits are added, as the inhomogeneous [red] bonds in FIG. 9, the answer checking algorithm is significantly enhanced. In this case the semi-random, constrained, inhomogeneous interconnects must have the mirror-image property. The answer-checking paradigm can also be accomplished if every interconnect that crosses the mirror plane is set to the largest negative value possible, leading to anti-cloning across the mirror.

The present invention provides for the addition, to underlying regular lattice couplers, of inhomogeneous connections or couplers between the qubits. The added inhomogeneous couplers decrease the average node-to-node distance (as traveled along the regular-lattice bonds and inhomogeneous lattice bonds) between two qubits. In addition, the added inhomogeneous couplers can be constrained, for example, by, among other advantages: 1) limiting the total number of couplers or inhomogeneous couplers a qubit may have, and/or 2) limiting the number of crossings of the added inhomogeneous couplers.

The '504 patent technology for classical digital computers connects processing elements (PEs) to each other, where there is an underlying regular or hierarchical [also known as fractal] lattice (with or without disorder) and added homogenous interconnects to decrease the PE-to-PE distance (when averaged over all PEs). The present invention constrains the added inhomogeneous interconnects in order to, among other advantages: 1) limit the number of connections each PE is allowed to have, and/or 2) limit the number of crossings or touchings of the added inhomogeneous interconnects.

The present invention generally comprises a computer or processor-based architecture or architectural framework for quantum computers and classical and/or digital computers. For quantum computers, which may be gated quantum computers or adiabatic quantum computers, for example, the framework provides for computer or processor-based functions, calculations, predictions, analyses, and/or simulations, for example, and comprises a multiplicity of quantum bits (qubits) for processing such computer functions. The multiplicity of qubits are or can be arranged in a one, two, or three dimensional regular lattice topology and the multiplicity of qubits are or can be located in a multi-dimensional interconnect topology.

Further, the framework provides for a plurality of regular lattice interconnects and/or bonds between the multiplicity of such qubits and a plurality of inhomogeneous interconnects and/or bonds between the multiplicity of qubits for connecting the qubits in order to increase the interconnects number or amount between the qubits. The number of interconnects increases and the properties of the graph are thereby modified, for example the average node-to-node distance $d_{d,Ave}$, such that the graph is effectively a higher dimensional graph. At least one regular lattice interconnect or at least one inhomogeneous interconnect, or a combination thereof, connects at least one qubit to at least one different qubit positioned remotely away from the at least one qubit. The amount or count of regular lattice interconnects between the multiplicity of qubits is separate from the total of qubits which thereby allows the amount or count of all such interconnects joining two or more qubits to increase, since the count of regular lattice interconnects is added to the count of inhomogeneous interconnects so that the total count is larger than for the count of regular lattice interconnects.

The plurality of inhomogeneous interconnects connects the multiplicity of qubits by a method of interconnects whereby the two or more qubits joined by the inhomogeneous interconnects are randomly chosen from among the total number of the multiplicity of qubits. Alternatively, the plurality of inhomogeneous interconnects may connect the multiplicity of qubits by a method of constrained randomness to choose the two or more qubits connected by the inhomogeneous interconnects to form at least one constrained random interconnect.

The architectural framework provides for the plurality of inhomogeneous interconnects to be located in one plane, or at most about ten planes, and the plurality of inhomogeneous interconnects do not overlap, touch, or cross within a given plane. The plurality of inhomogeneous interconnects between qubits are located in one plane and alternatively may be located in two planes or three planes or at most about ten planes.

Additionally, the plurality of regular lattice interconnects or bonds connect each qubit to each neighboring qubit adjacent to the respective qubit or otherwise form a regular lattice arrangement. At least one inhomogeneous interconnect or bond connects at least one qubit to at least one different qubit positioned remotely away from the respective at least one qubit.

One of the multiple benefits of the framework of the invention and its embodiments is that the inhomogeneous interconnects decrease the average node-to-node length of a graph associated with the architectural framework. A further embodiment is such that the at least one constrained random interconnect has a mirror-image property, so that the probability of a correct answer increases and the at least one constrained random interconnect actually clones or anti-clones, or both, the qubits and thereby optimally enhance the answer-checking algorithm of the quantum computer.

The at least one inhomogeneous interconnect is and/or may be constrained to limit the maximum number of connections between qubits or the maximum number of connections connecting a given qubit or that a given qubit may have or possess. Further, the at least one inhomogeneous interconnect is and/or may be constrained to minimize the number of crossings and/or touchings that the at least one inhomogeneous interconnect may have with itself or with at least one other inhomogeneous interconnect. Finally, the at least one inhomogeneous interconnect enhances the answer-checking features in an adiabatic quantum computer, for example.

The invention provides for at least one inhomogeneous interconnect that connects at least one first qubit to at least one different qubit and the framework has at least one regular lattice interconnect augmented by at least one additional inhomogeneous interconnect between the at least one first qubit and at least one different qubit. Additionally, the at least one regular lattice interconnect has and/or may have one or more missing qubits or missing connections between qubits, which makes the quantum computer framework having at least one regular lattice interconnect disordered. That disordered framework having at least one regular lattice interconnect is and/or may be augmented by at least one additional inhomogeneous interconnect between the at least one first qubit and at least one different qubit.

The at least one regular lattice interconnect or the disordered architectural framework that has at least one regular lattice interconnect, or both, is and/or can be a hierarchical lattice, a fractal lattice, or a combination thereof, either with disorder or without disorder, and the disordered architectural framework having at least one regular lattice interconnect is and/or may be likewise augmented by at least one additional inhomogeneous interconnect between the at least one first qubit and at least one different qubit. Here, the node-to-node distance between qubits is decreased compared to the distance between the regular lattice or the hierarchical lattice.

For classical computers and/or digital computers, the present invention provides a scalable computer or processor-based architecture or architectural framework for computer or processor-based scalable functions, calculations, predictions, analyses, and/or simulations, for example. Here, at least two processing elements or a collection of processing elements are/is provided, as is a plurality of inhomogeneous interconnects or bonds between the at least two processing elements or collection of processing elements. Further, the architecture provides at least one regular lattice interconnect, with or without disorder, or at least one hierarchical lattice interconnect, also with or without disorder. The at least one regular lattice interconnect or the at least one hierarchical lattice interconnect connects the at least two processing elements or collection of processing elements; the connection is and/or may be augmented by at least one inhomogeneous interconnect between the at least two processing elements or collection of processing elements. Finally, the at least one inhomogeneous interconnect is and/or may be constrained. The at least one inhomogeneous interconnect is constrained in order to limit the maximum number of connections within the at least two processing elements or collection of processing elements and/or to minimize the number of crossings and/or touchings that the at least one inhomogeneous interconnect may have with itself or with at least one other inhomogeneous interconnect.

The plurality of inhomogeneous interconnects connects the at least two processing elements or collection of processing elements by a method of constrained randomness to choose the at least two processing elements or collection of processing elements connected by the inhomogeneous interconnects.

Further, the plurality of inhomogeneous interconnects are and/or may be located in one plane, or at most about ten planes, and the plurality of inhomogeneous interconnects do not overlap, touch, or cross within a given plane. As a result, the plurality of inhomogeneous interconnects between the at least two processing elements or collection of processing elements are and/or may be located in one plane and, alternatively, are and/or may be located in two planes, three planes, or at most about ten planes.

The above detailed description is presented to enable any person skilled in the art to make and use the invention. Specific details have been revealed to provide a comprehensive understanding of the present invention, and are used for explanation of the information provided. These specific details, however, are not required to practice the invention, as is apparent to one skilled in the art. Descriptions of specific applications, analyses, and calculations are meant to serve only as representative examples. Various modifications to the preferred embodiments may be readily apparent to one skilled in the art, and the general principles defined herein may be applicable to other embodiments and applications while still remaining within the scope of the invention. There is no intention for the present invention to be limited to the embodiments shown and the invention is to be accorded the widest possible scope consistent with the principles and features disclosed herein.

While various embodiments of the present invention have been described above, it should be understood that they have been presented by way of example and not limitation. It will be apparent to persons skilled in the relevant art(s) that various changes in form and detail can be made therein without departing from the spirit and scope of the present invention. In fact, after reading the above description, it will be apparent to one skilled in the relevant art(s) how to implement the invention in alternative embodiments. Thus, the present invention should not be limited by any of the above-described exemplary embodiments.

The processes, methods, systems, materials and devices of the present invention, like related processes, methods, systems, materials and devices used in the computer and computer architecture and framework arts and in the framework interconnect arts, are complex in nature and are often best practiced by empirically determining the appropriate values of the operating parameters, or by conducting simulations to arrive at best design for a given application. Accordingly, all suitable modifications, combinations, and equivalents should be considered as falling within the spirit and scope of the invention. It should also be understood that the figures are presented for example purposes only. The present invention is sufficiently flexible and configurable such that it may be utilized in ways other than those shown in the accompanying figures.

REFERENCES

GUCLU2006 H. Guclu, G. Korniss, M. A. Novotny, Z. Toroczkai, and Z. Racz, "Synchronization Landscapes in Small-World-Connected Computer Networks", Physical Review E, volume 73, article 066115, 20 pages, (2006).

HASTIN2003 M. B. Hastings, "Mean-field and *anomalus* behavior on a small-world network", Physical Review Letters, volume 91, article 098701, 4 pages (2003).

KATZGR2014 H. G. Katzgraber, F. Hamze, and R. S. Andrist, "Glassy Chimeras could be blind to quantum speedup: Designing better benchmarks for quantum annealing machines", Physical Review X, volume 4, article 021008, 8 pages (2014).

KOLAKO2015 A. Kolakowska and M. A. Novotny, "Non-universal effects in mixing correlated-growth processes with randomness: Interplay between bulk morphology and surface roughening", Physical Review E, volume 91, article 012147, 8 pages, (2015).

KORNIS2003 G. Korniss, M. A. Novotny, H. Guclu, Z. Toroczkai, and P. A. Rikvold, "Suppressing Roughness of Virtual Times in Parallel Discrete-Event Simulations", Science, volume 299, pages 677-679, (2003).

MANDEL1977 B. B. Mandelbrot, *Fractals: Form, Chance, and Dimension* (W.H. Freeman and Co, New York, N.Y., 1977).

NOVOTN2006 Mark A. Novotny and Gyorgy Korniss, "Fully Scalable Computer Architecture", U.S. Pat. No. 6,996,504, filed Feb. 7, 2006.

NOVOTN2014 Mark A. Novotny, J. Spencer Hall, Thomas Neuhaus, Hans De Raedt, and Kristel Michielsen, to be submitted, unpublished.

RIEFFE2014 E. G. Rieffel and W. H. Polak, *Quantum Computing: A Gentle Introduction* (MIT Press, Cambridge, Mass., 2014).

RONNOW2014 T. F. Ronnow, Z. Wang, J. Job, S. V. Isakov, D. Wecker, J. M. Martinis, D. A. Lidar, and M. Troyer, "Defining and Detecting Quantum Speedup", Science, volume 345, pages 420-424, (2014).

WATTS1999 D. J. Watts, *Small Worlds, The Dynamics of Networks between Order and Randomness* (Princeton University Press, Princeton, N.J., 1999).

What is claimed is:

1. A computer architectural framework for quantum computers, the architectural framework comprising:

a multiplicity of quantum bits (qubits);

a plurality of regular lattice interconnects or bonds between the multiplicity of qubits; and a plurality of nodes connected by the bonds;

a plurality of inhomogeneous interconnects or bonds between the multiplicity of qubits for connecting the multiplicity of qubits to increase the number and desired graph properties of interconnects between qubits in the computer, whereby at least one regular lattice interconnect, at least one inhomogeneous interconnect, or both, connects at least one qubit to at least one different qubit remotely positioned away from the at least one qubit, wherein an amount of regular lattice interconnects between the multiplicity of qubits is separate from a total amount of qubit interconnects thereby allowing an amount of all such interconnects joining two or more qubits to increase, wherein the plurality of inhomogeneous interconnects connects the multiplicity of qubits by a method of constrained randomness to choose the two or more qubits connected by the inhomogeneous interconnects, thereby forming at least one constrained random interconnect, and wherein the at least one constrained random interconnect has a mirror-image or answer-checking property whereby the probability of a correct answer increases and the at least one constrained random interconnect clones or anti-clones, or both, the qubits thereby optimally enhancing the answer checking algorithm of the quantum computer, wherein an average path length or distance between nodes or node-to-node distance between qubits is minimized and thereby decreased by a semi-random inhomogeneous arrangement of bonds or constrained randomness by adding inhomogeneous connections or couplers between the qubits whereby the inhomogeneous connections or couplers are constrained by limiting the number of added connections or couplers a qubit may have, limiting the number of crossings or touchings of the added connections or couplers, or a combination thereof;

wherein the mirror-image or answer-checking property is formed by an inserted mirror plane between two halves of a lattice interconnect whereby all interconnects that cross the mirror plane are set to the highest positive value to clone an associated qubit on the other side of the mirror plane leading to cloning across the mirror plane or, alternatively, whereby all interconnects that cross the mirror plane are set to the largest negative value possible to anti-clone the associated qubit on the other side of the mirror plane leading to anti-cloning across the mirror plane;

wherein the plurality of inhomogeneous interconnects or bonds are constrained small world (SW) bonds whereby one constraint is that at most one SW bond can be attached to any qubit and another constraint is that the inhomogeneous interconnects or bonds can only connect top-to-top or bottom-to-bottom qubits;

wherein the computer architectural framework is comprised of constrained random small-world (SW) connections;

wherein the plurality of inhomogeneous interconnects between the multiplicity of qubits are located in two planes, three planes, or at most about ten planes; and wherein the plurality of inhomogeneous interconnects or bonds are arranged so that the interconnects or bonds in the same plane do not cross and so that the interconnects or bonds in different planes can be arranged in different directions, allowing for on-average longer interconnects and decreased average non-to-node distance.

2. The computer architectural framework of claim 1, wherein the quantum computer is a gated quantum computer or an adiabatic quantum computer.

3. The computer architectural framework of claim 1, wherein the plurality of inhomogeneous interconnects connects the multiplicity of qubits by a method of interconnects whereby the two or more qubits joined by the inhomogeneous interconnects are randomly chosen from among the total number of the multiplicity of qubits.

4. The computer architectural framework of claim 1, wherein the plurality of inhomogeneous interconnects are located in one plane or at most about ten planes and the plurality of inhomogeneous interconnects do not overlap, touch, or cross within a given plane.

5. The computer architectural framework of claim 1, wherein the plurality of inhomogeneous interconnects between qubits are located in one plane.

6. The computer architectural framework of claim 1, wherein the plurality of regular lattice interconnects or bonds connect each qubit to each neighboring qubit adjacent to the respective qubit or otherwise form a regular lattice arrangement, and wherein the at least one inhomogeneous interconnect connects at least one qubit to at least one different qubit remotely positioned away from the respective at least one qubit.

7. The computer architectural framework of claim 1, wherein the multiplicity of qubits are arranged in a one, two, or three dimensional regular lattice topology.

8. The computer architectural framework of claim 1, wherein the plurality of inhomogeneous interconnects decreases the average node-to-node length of a graph associated with the architectural framework.

9. The computer architectural framework of claim 1, wherein the multiplicity of qubits are located in a multi-dimensional interconnect topology.

10. The computer architectural framework of claim 1, wherein the at least one inhomogeneous interconnect connects at least one first qubit to at least one different qubit and wherein the architectural framework having at least one regular lattice interconnect is augmented by at least one additional inhomogeneous interconnect between the at least one first qubit and at least one different qubit.

11. The computer architectural framework of claim 10, wherein the at least one regular lattice interconnect has one or more missing qubits or missing connections between qubits, thereby making the architectural framework having at least one regular lattice interconnect disordered, and wherein the said disordered architectural framework having at least one regular lattice interconnect is augmented by at least one additional inhomogeneous interconnect between the at least one first qubit and at least one different qubit.

12. The computer architectural framework of claim 11, wherein the at least one regular lattice interconnect or the disordered architectural framework having at least one regular lattice interconnect, or both, is a hierarchical lattice, a fractal lattice, or both, either with or without disorder, and wherein the said disordered architectural framework having at least one regular lattice interconnect is augmented by at least one additional inhomogeneous interconnect between the at least one first qubit and at least one different qubit.

13. The computer architectural framework of claim 12, wherein the node-to-node distance between qubits is decreased compared to the distance between the regular lattice or hierarchical lattice.

14. The computer architectural framework of claim 10, wherein the at least one inhomogeneous interconnect is constrained to limit the maximum number of connections between qubits or the maximum number of connections connecting a given qubit.

15. The computer architectural framework of claim 10, wherein the at least one inhomogeneous interconnect is constrained to minimize the number of crossings and/or touchings that the at least one inhomogeneous interconnect may have with itself or with at least one other inhomogeneous interconnect.

16. The computer architectural framework of claim 10, wherein the at least one inhomogeneous interconnect enhances the answer-checking features in an adiabatic quantum computer.

17. A scalable computer architectural framework for classical digital computers, the scalable architectural framework comprising:

at least two processing elements or a collection of processing elements;

a plurality of inhomogeneous interconnects or bonds between the at least two processing elements or collection of processing elements; and at least one regular lattice interconnect with or without disorder, or at least one hierarchical lattice interconnect with or without disorder, wherein the at least one regular lattice interconnect or the at least one hierarchical lattice interconnect connects the at least two processing elements or collection of processing elements and wherein the connection is augmented by at least one inhomogeneous interconnect between the at least two processing elements or collection of processing elements and the at least one inhomogeneous interconnect is constrained, wherein the plurality of inhomogeneous interconnects connects the at least two processing elements or collection of processing elements by a method of constrained randomness to choose the two or more processing elements or collection of processing elements connected by the inhomogeneous interconnects, thereby forming at least one constrained random interconnect, wherein an average path length or distance between the at least two processing elements or collection of processing elements is minimized and thereby decreased by constrained randomness by adding inhomogeneous connections or couplers between the at least two processing elements or collection of processing elements whereby the inhomogeneous connections or couplers are constrained by limiting the number of added connections or couplers that the at least two processing elements or collection of processing elements may have, limiting the number of crossings or touchings of the added connections or couplers, or a combination thereof:

wherein the plurality of inhomogeneous interconnects or bonds are constrained small world (SW) bonds whereby one constraint is that at most one SW bond can be attached to the at least two processing elements and another constraint is that the inhomogeneous interconnects or bonds can only connect the at least two processing elements top-to-top or bottom-to-bottom;

wherein the computer architectural framework is comprised of constrained random small-world (SW) connections wherein the plurality of inhomogeneous interconnects between the at least two processing elements or collection of processing elements are located in two planes, three planes, or at most about ten planes; and wherein the plurality of inhomogeneous interconnects or bonds are arranged so that the interconnects or bonds in the same plant do not cross and so that the interconnects or bonds in different planes can be arranged in different directions, allowing for on-average longer interconnects.

18. The scalable computer architectural framework for classical digital computers of claim 17, wherein the at least one inhomogeneous interconnect is constrained to limit the maximum number of connections within the at least two processing elements or collection of processing elements.

19. The scalable computer architectural framework for classical digital computers of claim 17, wherein the at least one inhomogeneous interconnect is constrained to minimize the number of crossings and/or touchings that the at least one inhomogeneous interconnect may have with itself or with at least one other inhomogeneous interconnect.

20. The scalable computer architectural framework for classical digital computers of claim 17, wherein the plurality of inhomogeneous interconnects connects the at least two processing elements or collection of processing elements by a method of constrained randomness to choose the at least two processing elements or collection of processing elements connected by the inhomogeneous interconnects.

21. The scalable computer architectural framework for classical digital computers of claim 17, wherein the plurality of inhomogeneous interconnects are located in one plane or at most about ten planes and the plurality of inhomogeneous interconnects do not overlap, touch, or cross within a given plane.

22. The scalable computer architectural framework for classical digital computers of claim 17, wherein the plurality of inhomogeneous interconnects between the at least two processing elements or collection of processing elements are located in one plane.

* * * * *